US005920782A

United States Patent [19]

Shih et al.

[11] Patent Number: 5,920,782

[45] Date of Patent: Jul. 6, 1999

[54] METHOD FOR IMPROVING HOT CARRIER DEGRADATION

[75] Inventors: Hsueh-hao Shih, Hsinchu; Wen-Kuan Yeh, Hsinchu Hsien, both of Taiwan

[73] Assignee: United Microelectronics Corp., Taiwan

[21] Appl. No.: 08/989,627

[22] Filed: Dec. 12, 1997

[30] Foreign Application Priority Data

Jul. 18, 1997 [TW] Taiwan .............................. 86110198

[51] Int. Cl.$^{6}$ .............................................. H01L 21/336

[52] U.S. Cl. ........................ 438/303; 438/528; 438/305

[58] Field of Search .............................. 438/525, 301, 438/303, 305, 528

[56] References Cited

U.S. PATENT DOCUMENTS 4,243,435 1/1981 Barile et al. .

5,750,435 5/1998 Pan ........................................ 438/525

*Primary Examiner*—Richard A. Booth

*Attorney, Agent, or Firm*—Rabin & Champagne, P.C.

[57] ABSTRACT

A method of improving hot carrier degradation comprises a silicon substrate on which an isolation oxide layer is formed to define an active region. The active region comprises a gate including a gate oxide layer. A thin oxide layer is formed over the gate, the isolation oxide layer, and the silicon substrate. With a tilt angle, a nitrogen ion is implanted into the interface between the gate and the silicon substrate at a corner. The gate oxide layer is thus nitridized. After a spacer around the gate is formed, a post heat annealing is performed. Using nitrogen ion implantation with a wide angle, the hot carrier degradation can be improved, and the reliability of gate oxide layer is enhanced.

13 Claims, 1 Drawing Sheet

16 12 18 12 14 10

20 θ θ 20 16 12 12 18 14 10

METHOD FOR IMPROVING HOT CARRIER DEGRADATION

BACKGROUND OF THE INVENTION

1. Field of the Invention

The invention relates to a method of a gate oxide layer treatment, and more particular to a fabricating method for improving hot carrier degradation.

2. Description of the Related Art

The major function of silicon oxide layer formed using oxidation in semiconductor fabrication process is to be used as a gate oxide layer in metal-oxide-semiconductor (MOS) devices. Since the electrical characteristic of the gate oxide layer affects the quality of the MOS tremendously, too much dopant or charge changes the threshold voltage of on/off switches in MOS devices. Moreover, the breakdown voltage is lowered, and the "time-dependent dielectric breakdown (TDDB)" associated with the product reliability is degraded (that is, the lifetime is shortened).

To enhance the reliability of the gate oxide layer, a conventional method of nitridizing an oxide layer, for example, heating in a furnace or rapid thermal annealing in a nitrogen or nitrous oxide environment for nitridization, is proposed. The conventional method improves the hot carrier resistance of devices and suppresses the penetration of doped ions from the subsequently formed gate to the gate oxide layer. However, by this technique, fixed oxide charges which affect the electrical characteristics of gate oxide are caused, and a maximum mobility degradation is reached. Furthermore, the high temperature treatment of nitridation is very complicated, and therefore, a nitrous oxide layer with a high quality is difficult to obtain.

Another way of enhancing the reliability of a gate oxide layer is proposed in "Highly Reliable 0.15 μm MOSFETs Surface Proximity Gettering (SPG) and Nitrided Oxide Spacer Using Nitrogen Implantation" in "1995 Symposium on VLSI Technology Digest of Technical paper", p. 19–20 by T. Kuroi et. al.. In this method, after a spacer is formed, nitrogen ion implantation is performed to improve the quality of spacer oxide layer, and thus, enhance the reliability of products. However, this technique cannot prevent the hot carrier degradation caused in the interface between the silicon oxide layer and the silicon substrate at the corner of the gate oxide layer near the spacer.

SUMMARY OF THE INVENTION

It is therefore an object of the invention to utilize the advantage of using the nitrous oxide layer in the conventional method. Providing a new fabricating method of nitridation treatment, the reliability of a gate oxide layer is enhanced and other problems caused in the conventional method are improved.

To achieve these objects and advantages, and in accordance with the purpose of the invention, as embodied and broadly described herein, the invention is directed towards a method to improve hot carrier degradation. A substrate on which an isolation oxide layer is formed to define an active region is provided. A gate including a gate oxide layer is formed on the active region. A thin oxide layer is formed and covers the gate, the isolation oxide layer, and the silicon substrate. A nitrogen ion is implanted into the corner in the interface between the gate and the silicon substrate with an angle to nitridize the gate oxide layer. A spacer around the gate is formed and followed by rapid thermal annealing treatment.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of the specification, illustrate an embodiment of the invention and together with the description, serve to explain the principles of the invention. In the drawings.

DESCRIPTION OF THE PREFERRED EMBODIMENTS

Figure 1A:
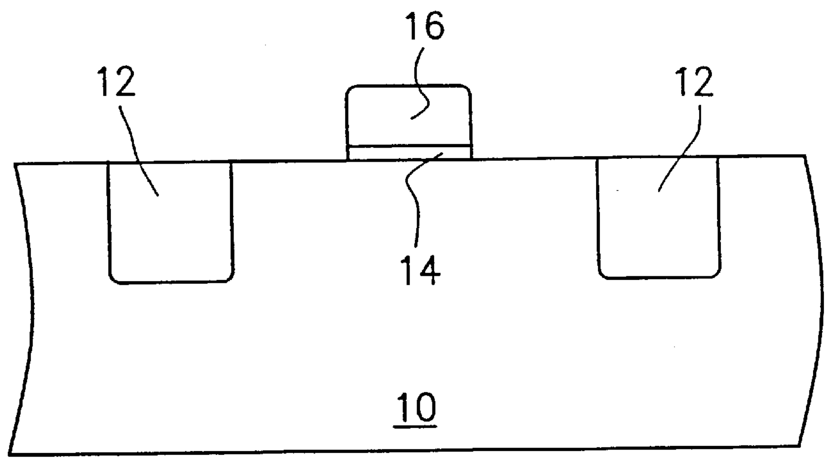
FIG. 1*a* to FIG. 1*c* are a cross-sectional views which show a method of improving hot carrier degradation by wide angle ion implantation in a preferred embodiment according to the invention.

Referring to FIG. 1*a,* a silicon substrate 10 is provided. An isolation oxide layer 12, such as a field oxide layer (FOX), or a shallow trench isolation (STI), is formed on the silicon substrate 10 to define an active region (not shown in the figure). A gate 16 including a gate oxide layer 14 is formed on the active region.

Figure 1B:
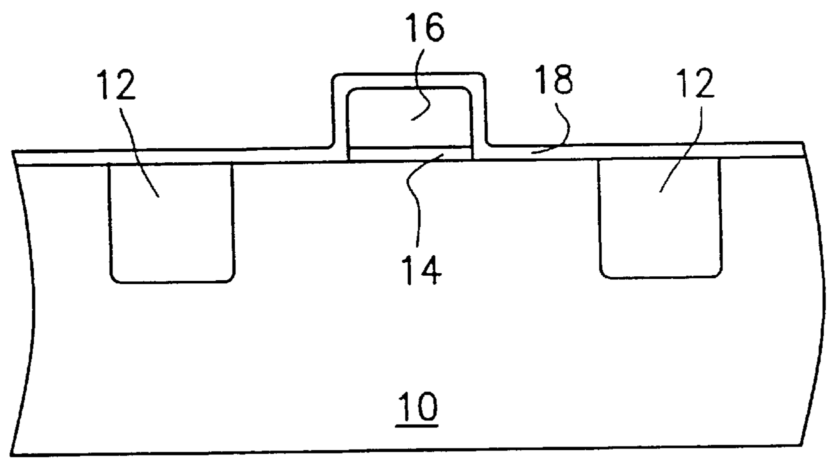

Referring to FIG. 1*b,* a thin oxide layer 18, for example, a silicon oxide layer having a thickness of about 200 Å, is formed and covers the silicon substrate 110, the isolation oxide layer 12, and the gate 18. Thus, while performing subsequent ion implantation, the damage due to the bombardment of ion implantation into the gate oxide layer 14 is prevented.

Figure 1C:
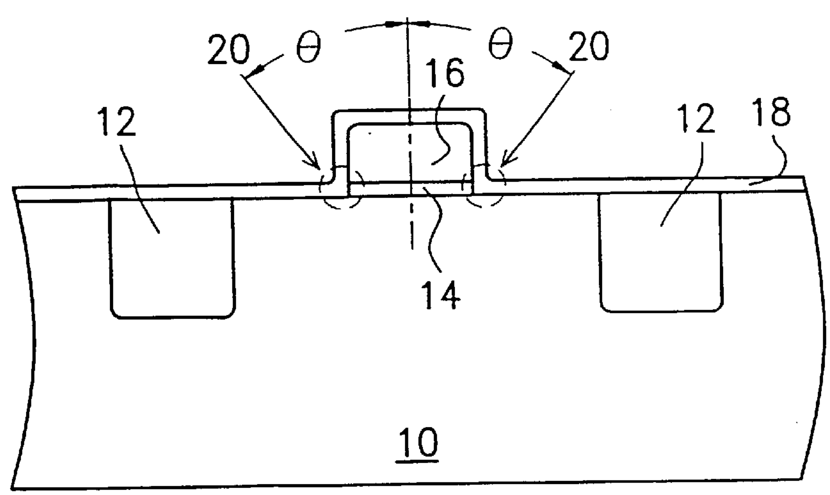

Referring to FIG. 1*c,* using an ion implantation with a tilt angle, a nitrogen ion 20 is implanted into the interface between the gate 16 and the silicon substrate 10 at the corner (shown as the dash-line circle in the figure). The nitrogen ion is implanted at an angle of about 15° to 60°. The dosage of the nitrogen ion is about 1E13 atoms/$cm^2$ to 5E15 atoms/$cm^2$ at an energy of about 10 KeV to 50 KeV. Before or after ion implantation, a lightly doped drain (LDD) of source/drain is performed (not shown). By the implantation of nitrogen ion 20 into the interface between the silicon oxide layer and the silicon substrate at the corner of gate oxide layer 14, the silicon-nitrogen bond replaces the previous silicon-oxide bond. The resulting silicon-nitride bond suppresses the trapped charges at the boundary, and thus, the hot carrier effect due to the shrinkage of MOS device linewidth is reduced. As a result, the hot carrier degradation is improved. The combination reaction caused by the implanted nitrogen ion can also avoid implanted ion to penetrate from gate 16 to gate oxide layer. After the spacer around the gate 16 is formed, using rapid thermal process to perform a post heat treatment, the implanted ion in source/drain is then distributed uniformly. The damage of source/drain caused from ion implantation can be mended as well.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of improving hot carrier degradation, comprising:

providing a silicon substrate, on which an isolation oxide layer is formed to define an active region having a gate including a gate oxide layer thereon;

forming a thin oxide layer over the gate, the isolation oxide layer, and the silicon substrate;

performing ion implantation including implanting nitrogen ions, at a tilt angle, into an interface between the gate and the gate oxide layer at a corner, to nitridize the gate oxide layer and a portion of the thin oxide layer that covers the corner interface;

forming a spacer around the gate; and performing a post annealing treatment.

2. The method according to claim 1, wherein the thin oxide layer serves to prevent the gate oxide layer from being damaged during the ion implantation and has a thickness of about 200 Å.

3. The method according top claim 1, wherein the tilt angle is in the range of about 15° to 60°.

4. The method according to claim 1, wherein the performing ion implantation is performed at an energy level of about 10 KeV to 50 KeV.

5. The method according to claim 1, wherein the performing ion implantation is performed with a dosage of about 1E13 atoms/cm$^2$ to 5E15 atoms/cm$^2$.

6. The method according to claim 1, wherein a step of forming a lightly doped drain is further included before performing ion implantation.

7. The method according to claim 1, wherein a lightly doped drain step is further included after performing ion implantation.

8. The method according to claim 1, wherein the post heat annealing treatment is performed to prevent damage caused by ion implantation.

9. The method according to claim 1, wherein the implanting nitrogen ions includes implanting nitrogen ions at the tilt angle into the interface between the gate and gate oxide layer at the corner, through the thin oxide layer.

10. The method according to claim 1, wherein the gate has sidewalls and the forming a thin oxide layer includes forming a thin oxide layer on the sidewalls of the gate.

11. The method according to claim 1, wherein the thin oxide layer has a thickness of about 200 Å.

12. The method according to claim 1, further comprising protecting the gate and gate oxide layer from damage by the nitrogen ions during ion implantation, with the thin oxide layer.

13. A method of improving hot carrier degradation, comprising:

providing a silicon substrate on which an active region is defined between isolation oxide layers formed therein;

forming a gate oxide layer over the active region;

forming a gate electrode on the gate oxide layer;

forming a thin oxide layer over the gate electrode, the isolation oxide layers, and the silicon substrate; and at a tilt angle, implanting ions, including nitrogen ions, through the thin oxide layer and into a corner interface between the gate electrode and the gate oxide layer to nitridize a portion of the gate oxide layer at the corner interface and a portion of the thin oxide layer covering the substrate and the gate electrode at the corner interface, wherein a silicon-nitride bond is defined by the portion of the gate oxide layer and the portion of the thin oxide layer.

* * * * *